United States Patent [19]

Lebowitz et al.

[11] Patent Number: 4,914,502
[45] Date of Patent: Apr. 3, 1990

[54] LATERALLY MARCHING INTERCONNECTING LINES IN SEMICONDUCTOR INTERGRATED CIRCUITS

[75] Inventors: Joseph Lebowitz, Watchung; William T. Lynch, Summit, both of N.J.

[73] Assignee: AT&T Bell Laboratories, Murray Hill, N.J.

[21] Appl. No.: 147,038

[22] Filed: Jan. 29, 1988

Related U.S. Application Data

[63] Continuation of Ser. No. 899,982, Aug. 25, 1986, abandoned.

[51] Int. Cl.[4] .......................................... H01L 23/48
[52] U.S. Cl. ................................... 357/68; 357/23.6; 357/45
[58] Field of Search ............... 357/23.6, 41, 45, 68, 357/24 R; 365/149, 184, 185

[56] References Cited

U.S. PATENT DOCUMENTS

| | | |
|---|---|---|
| 3,946,421 | 3/1976 | Hartsell et al. .................. 357/68 |
| 4,092,734 | 5/1978 | Collins et al. ................... 357/24 |
| 4,206,370 | 6/1980 | Leach .............................. 357/24 |
| 4,238,694 | 12/1980 | Kimerling et al. ............... 357/45 |
| 4,242,700 | 12/1980 | Weimer ........................... 357/24 |
| 4,251,876 | 2/1981 | McKenny et al. ............... 357/45 |
| 4,402,063 | 8/1983 | Wittwer .......................... 365/154 |
| 4,589,008 | 5/1986 | Stewart et al. .................. 357/45 |
| 4,591,891 | 5/1986 | Chatterjee et al. .............. 357/45 |
| 4,651,183 | 3/1987 | Lange et al. .................... 357/45 |

Primary Examiner—Joseph E. Clawson, Jr.
Attorney, Agent, or Firm—David I. Caplan

[57] ABSTRACT

In order to reduce parasitic capacitive cross-coupling in an integrated circuit, metallization lines in an array—for example, an array of word lines, of bit lines, or of bus interconnects—are geometrically arranged in a systematically progressive laterally (sidewise) marching sequence, whereby the identity of the lines located on either side of a given line keeps changing.

3 Claims, 2 Drawing Sheets

LATERALLY MARCHING INTERCONNECTING LINES IN SEMICONDUCTOR INTERGRATED CIRCUITS

This application is a continuation of application Ser. No. 06/899,982, filed Aug. 25, 1986, now abandoned.

FIELD OF THE INVENTION

This invention relates to semiconductor integrated circuits, and more particularly to schemes for arranging interconnecting metallization lines in such circuits.

BACKGROUND OF THE INVENTION

Semiconductor integrated circuits typically are formed by MOS (metal oxide semiconductor) or by bipolar transistors that are integrated at a top planar major surface of a silicon chip. Electrical interconnections between various transistors, as well as between certain transistors and access pins typically located along the periphery of the chip, have typically taken the form of two (or more) "levels" of interconnections, i.e., electrically conducting lines in the form of metallization stripes running along two (or more) essentially planar surfaces that are oriented mutually parallel to, and are insulated from, both each other and the top planar surface of the chip by suitable insulating layers. Interconnection vias (windows) in the insulating layers are provided whenever they are needed in accordance with the desired circuit interconnections.

In a variety of such integrated circuits—such as random access memories (RAM) and logic circuits—the electrical circuit requires interconnections by means of a number of electrically conducting lines which conveniently are geometrically arranged in the form of an array of mutually parallel metallization stripes. For example, in a DRAM (dynamic RAM) an array of parallel word lines—each word line enabling access to an array of bits, typically hundreds to thousands, by a mutually perpendicular set of bit lines—contains typically hundreds (or more) of parallel word lines. As a consequence, the unavoidable parasitic capacitance across each pair of neighboring word lines gives rise to electrical cross-coupling or "cross-talk" between such word lines, whereby desired electrical access to any given word line, for the purpose of enabling the writing of new information (corresponding to a new word) into the given word line or for reading the existing information (word) stored in the selected line of the memory, results in undesired spurious access to, and consequent spurious writing or reading of information into or out of, the non-accessed neighboring word(s). That is, access to any given word line may spuriously influence the stored charge in the memory cells of the neighboring word line(s) that is (are) supposedly not being accessed. The term "pattern sensitivity" has been applied to this undesirable phenomenon. A similar cross-talk noise problem can be encountered in a parallel array of bit lines. Similarly, in other integrated circuits such as logic circuits, parasitic cross-coupling between neighboring lines—such as lines of a bus, as used for bus-bar routing of interconnections—can give rise to spurious electrical cross-talk between neighboring lines. This cross-talk reduces the sensitivity of the original detection and can result in errors. Accordingly it would be desirable to have an arrangement of lines that avoids such cross-talk.

SUMMARY OF THE INVENTION

Cross-coupling between neighboring interconnecting lines in a semiconductor integrated-circuit—such as between neighboring word lines in a DRAM—is reduced by the use of "laterally (sideways) marching" it is meant for example that, in an array of lines in the XY plane arranged for transmitting signals along the X direction, each line runs for a first segment along the X direction at constant Y coordinate for only a relatively short first distance (as compared with the total length of the line), then marches to a new Y coordinate, and then runs for a second segment along the X direction at the new Y coordinate for only a relatively short second distance, then marches to another new Y coordinate, and so forth. In this way, the identity of the next neighboring lines on both sides of any given line keeps changing from segment to segment. Hence the parasitic capacitance between any pair of lines is significantly reduced, the parasitic capacitance between a given line and other next neighboring lines thereby being distributed, and hence dissipated, among many other lines, instead of among just two other (fixed) neighboring lines as in prior art. The lines themselves can serve as the word lines (or the bit lines) in a memory circuit such as a DRAM, as bus lines of a data bus in a microprocessor or other logic circuit, or as any other interconnecting lines in parallel array of conducting lines in an integrated circuit.

BRIEF DESCRIPTION OF THE DRAWING

This invention, together with its features, advantages, and characteristics may be better understood from the following detailed description when read in conjunction with the drawing in which.

Only for the sake of clarity the figures are not drawn to any scale.

DETAILED DESCRIPTION

Figure 1:
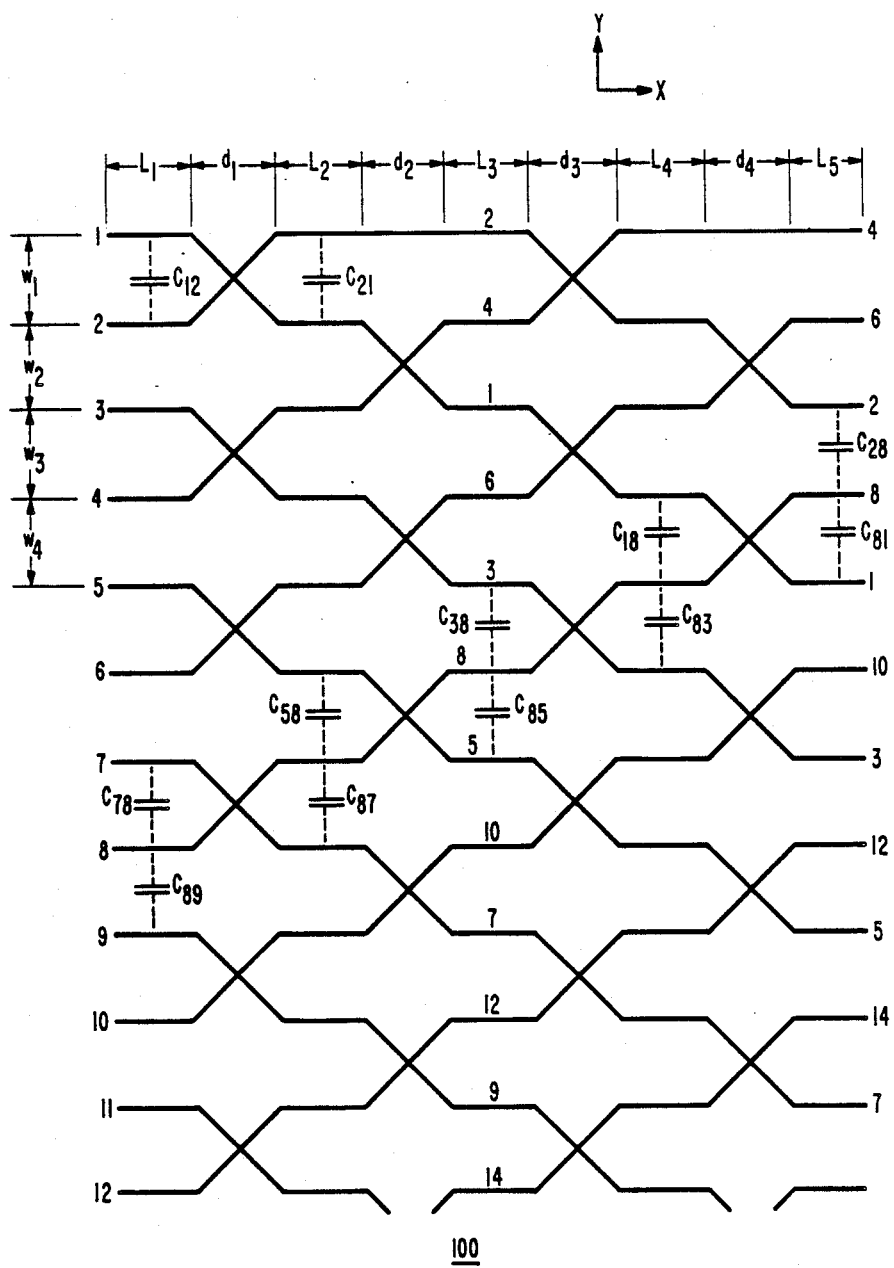
FIG. 1 is a stick diagram showing the physical layout of an illustrative portion of an array of interconnecting lines in accordance with an embodiment of the invention.

FIG. 1 shows an array 100 of electrically conducting lines 1,2,3, . . . 12 in an integrated circuit (not shown), in accordance with an embodiment of the invention. The (odd-numbered) line 1, for example, starts at the upper-left-hand corner, runs for a distance $L_1$ in the X direction to form a first segment, then marches in the $-Y$ direction for a distance $W_1$, while running in the X direction for a distance $d_1$, and so forth, until it reaches the extreme right-hand edge of FIG. 1. On the other hand, the (even-numbered) line 2 starts at a position located at the left-hand edge at a distance $W_1$ as measured in the $-Y$ direction from the extreme left-hand-edge of the line 1, runs for a distance $L_1$ in the X direction, marches in the $+Y$ direction for the distance $W_1$, while running in the X direction for the distance $d_1$, then runs along the X direction for a distance $(L_2+d_2+L_3)$, in the $-Y$ direction for the distance $W_1$ while running along the X direction for a distance $d_3$, and continues in this (X, $-Y$) manner until it reaches the extreme right-hand-edge of the layout. Cross-coupling parasitic capacitances $C_{12}$, $C_{21}$, etc., between neighboring segments of adjacent lines are indicated by dotted lines. For clarity, not all parasitic capacitors are shown in FIG. 1. It should be understood, of course, that the layout of the array 100 in general can and generally will extend farther in both the X and Y directions than actually shown in the Figure, to form a regular pattern. Thus FIG. 1 shows only an illustrative portion of an array of marching lines.

In general, as seen in FIG. 1, each even-numbered line begins its march in the +Y direction as it runs along the X direction and continues its march in the +Y direction unless and until it reaches the top extremity (Y=maximum)—in which case it marches thereafter in the −Y direction as it runs still farther along the X direction. Similarly, an odd-numbered line begins its march in the −Y direction, and when the line reaches the bottom extremity (−Y=maximum) it marches thereafter in the +Y direction as it runs still farther along the +X direction after pausing in the Y direction for a distance ($L_i+d_i+L_{i+1}$) along the X direction, where i is an integer corresponding to the position (along the X direction) of the bottom extremity. It should be clear from the illustration that one half of the lines are marching in the +Y direction while the other half marches in the −Y direction at any given location X of the array, except that when a line reaches the upper (+Y) or lower (−Y) extremity of the array, it begins marching in the opposite direction, as previously described.

For the sake of orderliness and regularity (but not essential to the goal of decreasing parasitic coupling) all L's are made equal, as are all W's and all d's: $L_1=L_2=L_3=\ldots$; $W_1=W_2=W_3=\ldots$; and $d_1=d_2=d_3=\ldots$. In practice, each of the L's would be a sufficiently small fraction of the overall line length so that there are many crossovers per line and hence sufficient dispersion of the parasitic capacitance, the W's would be governed by the particular design or layout, and the d's would be determined by the particular means of crossing lines. Note that, for a typical example, the cross-coupling parasitic capacitance ($C_{12}+C_{21}$) between lines 1 and 2 is relatively small as compared to what it would be in prior art where these lines would be situated close together and geometrically parallel throughout their total extents in the X direction, because of the relatively small running distance ($L_1+d_1+L_2$) of close approach in accordance with this invention as compared with the prior art's running distance of close approach equal to the total extent of the lines 1 and 2—it being understood that all the lines 1,2, ... 12 can, and typically do, extend much farther in the ±X direction than is actually shown in FIG. 1.

The maximum number of crossovers ($d_1, d_2, d_3, \ldots$) should advantageously equal one less than the total number of lines. The implementation with the number of crossovers equal to one less than the number of lines provide the maximum dispersion and hence reduction of coupling capacitance, with each line having an equal amount of coupling capacitance to every other line.

It should be further understood that crossings of adjacent lines are realized in an integrated circuit by means of standard cross-over techniques utilizing two (or more) levels of interconnect metallization in which cross-overs are formed typically where one of the lines locally crosses over (or under) a second line by means of a second level of interconnection, while the second line maintains itself on the same metallization level and marches (up or down) to its new Y positions. Two windows and one crossover (or crossunder) segment are ordinarily used for each $d_i$ interval.

Figure 2:
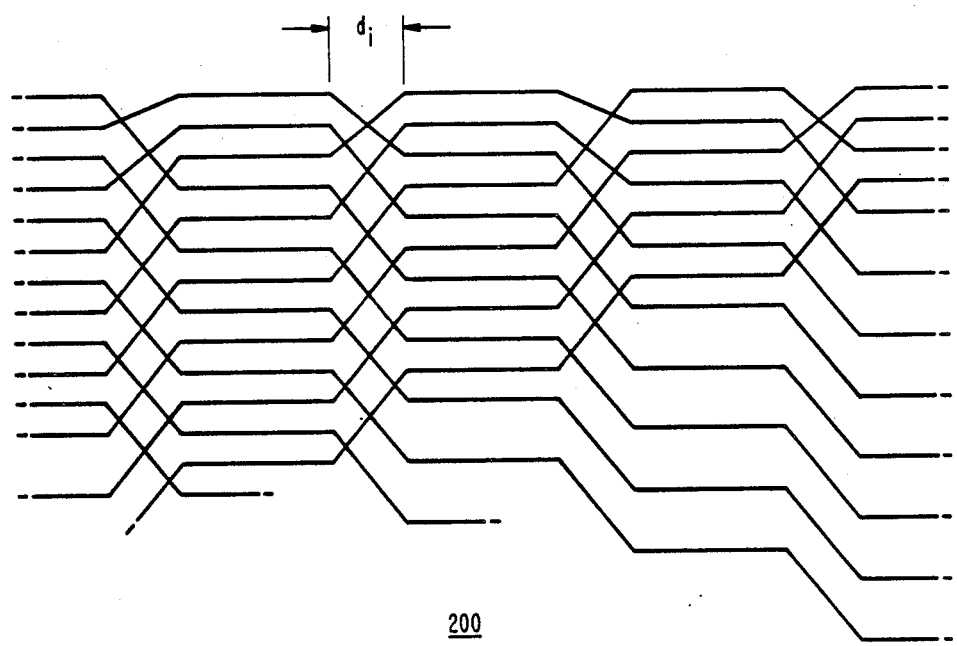
FIG. 2 is a stick diagram showing the physical layout of an illustrative portion of an array of interconnecting lines in accordance with another embodiment.

The embodiment shown in FIG. 1 is a particularly orderly scheme for reducing (and minimizing) nearest neighbor crosstalk to other lines in the array. FIG. 2 shows another embodiment 200, for achieving a similar beneficial result in accordance with the invention, having triple crossovers at each $d_i$ interval.

Although the invention has been described in detail in terms of a specific embodiment, various modifications can be made without departing from the scope of the invention.

What is claimed is:

1. A semiconductor integrated circuit including an interconnection array comprising a multiplicity of conductivity metallization lines located on a surface of a semiconductor body within a metallization area bounded by a pair of parallel edges, all the lines being mutually essentially parallel everywhere except in a plurality of separate crossing regions each extending between the pair of essentially parallel edges and in each of which every line, or every line except for the lines located closest to the edges, crosses at least one other line, whereby each of the lines is divided into a plurality of mutually essentially parallel segments each of which runs between successive crossing regions, such that the nearest neighboring segment with respect to each such line (e.g., 1) on one side thereof located between first and second successive crossing regions ($d_2, d_3$) is a segment of another line (e.g., 6) and such that the nearest neighboring segment with respect to such line (e.g., 1) on the one side thereof between the second and a third successive crossing region (e.g., $d_3, d_4$) is a segment of yet another line (e.g., 8) different from such another line (e.g., 6).

2. A circuit according to claim 1 in which the nearest neighboring segment with respect to each such line (e.g., 1) on the other side thereof, located between the first and second regions (e.g., $d_2, d_3$), is a segment of still another line (e.g., 4) different from such another line (e.g., 6) and from such yet another line (e.g., 8).

3. In a semiconductor integrated circuit, a metallization area located on a surface of the semiconductor, the area having first and second boundaries each of which is essentially parallel to a first (e.g., X) direction, a multiplicity of interconnection metallization lines located in said area, each of the lines comprising a sequential series of at least first and second successive segments (e.g., $L_3, L_4$) essentially parallel to the first (e.g., X) direction and of at least first and second successive non-parallel crossover portions (e.g., $d_3, d_4$), the first and second segments of all the lines respectively located within first and second separate segmental regions, and the first and second crossover portions of all the lines respectively located within first and second separate crossing regions, each of the segmental and the crossing regions extending essentially from the first to the second boundary, each of the lines in the first crossing region, or each of the lines in the first crossing region except for first and second outermost lines therein located closest respectively to the first and second boundaries, crossing a different one of the lines, and each of the lines in the second crossing region, or each of the lines in the second crossing region except for third and fourth outermost lines therein located closest respectively to the first and second boundaries, crossing a different one of the lines, the different one also being different from the line which was crossed by such line in the first crossing region.

* * * * *